United States Patent [19]

Bash et al.

[11] 4,220,951
[45] Sep. 2, 1980

[54] METHOD AND SYSTEM FOR PROTECTING BARGE

[75] Inventors: Leroy A. Bash, Houston; Raymond B. Cherry, Dickinson; Robert M. Speck, Richmond; William N. McDuffie, Rosenberg, all of Tex.

[73] Assignee: Cathodic Protection Services, Inc., Houston, Tex.

[21] Appl. No.: 946,901

[22] Filed: Sep. 28, 1978

[51] Int. Cl.² .............................................. G01R 31/02
[52] U.S. Cl. ................................... 340/649; 340/652; 361/216
[58] Field of Search .................. 340/649, 652; 324/51; 361/42, 45, 215–220

[56] References Cited

U.S. PATENT DOCUMENTS

| | | | |
|---|---|---|---|
| 2,611,862 | 9/1952 | Riddle et al. | 340/649 |
| 3,223,604 | 12/1965 | Marsh et al. | 361/216 |
| 3,343,154 | 9/1967 | Seesselberg | 340/649 |
| 3,913,010 | 10/1975 | Scarpino | 324/51 |
| 4,075,675 | 2/1978 | Burkett et al. | 340/649 |
| 4,110,807 | 8/1978 | Neuhouser | 340/652 |

*Primary Examiner*—Gerald L. Brigance
*Attorney, Agent, or Firm*—Michael P. Breston

[57] ABSTRACT

When explosive fuels such as hydrocarbons are pumped into or out of a barge or tanker, a metallic conduit having an insulated flange therein is typically connected to the barge. The method of this invention involves connecting the barge to the earth through a barge-grounding cable, connecting the metallic conduit to the earth through a conduit-grounding cable, whereby a grounding test circuit is established with a current source connected between the earth and the grounding cables. A flange resistor is connected across the insulated flane to form a flange circuit. The currents flowing through the grounding cables are being continuously monitored in the grounding circuit to determine the presence of a broken connection or of an ineffective electric contact. A continuity test is also continuously being made of the flange insulation in the flange. A plurality of sensing relays are operatively coupled to the grounding test circuit and to the flange circuit for sensing the currents flowing in the grounding test circuit and in the flange circuit. The sensing relays are operatively interconnected through suitable switching means with an alarm circuit having warning devices which can be continuously or intermittently operated to indicate safe and dangerous operating conditions.

8 Claims, 1 Drawing Figure

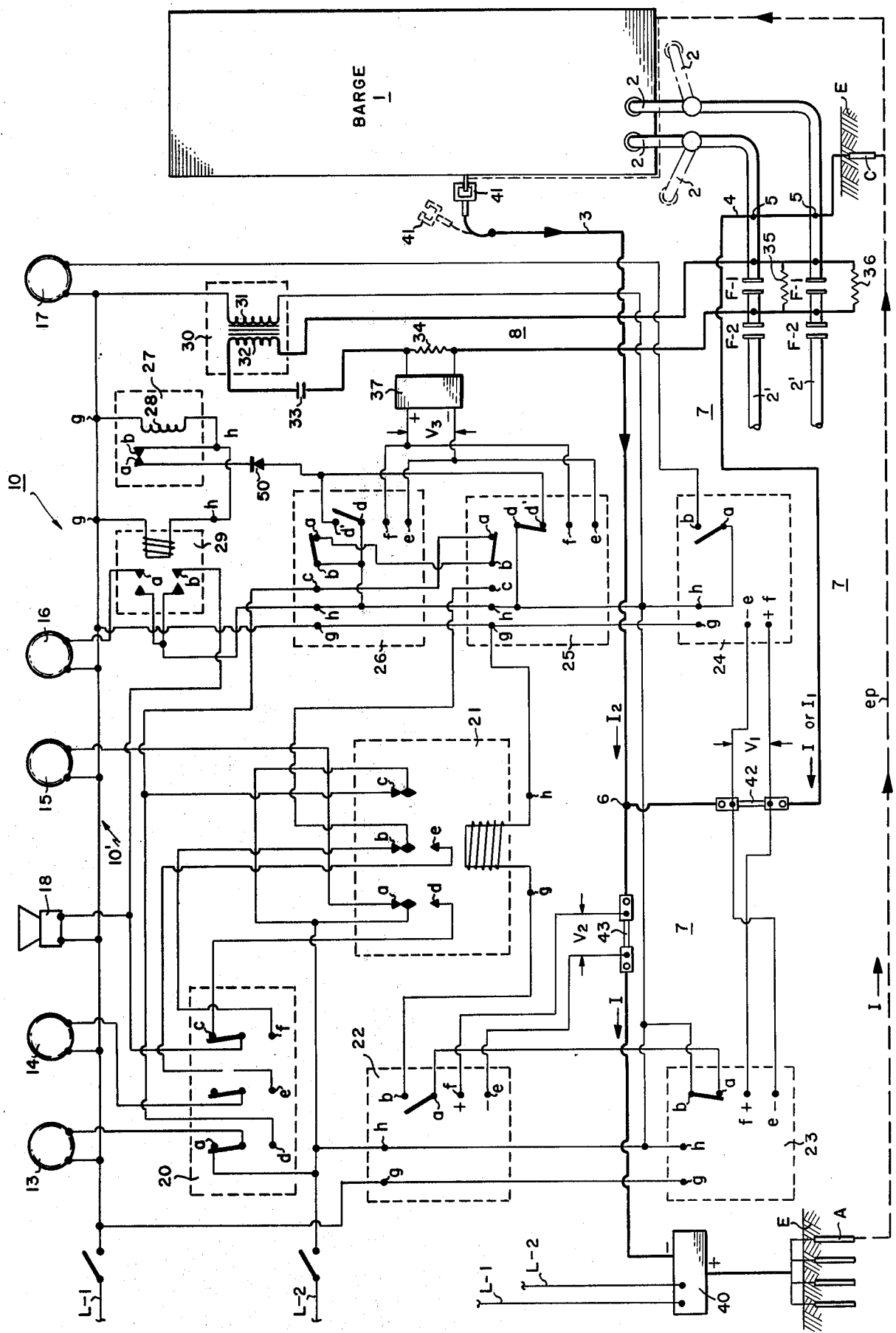

METHOD AND SYSTEM FOR PROTECTING BARGE

BACKGROUND OF THE INVENTION

When a barge is docked for receiving or unloading explosive fluids, such as hydrocarbons, metallic loading arms or hoses are connected to the barge. The explosive fluids are then pumped into/or from suitable storage tanks via conduits connected to the loading arms. Both the barge and the loading arms are in an electrolytic circuit. When the loading arms are connected to the barge, electric current will flow into the loading arms because there is a potential difference therebetween, say on the order of 0.5 volts. This potential difference is increased to say 1.0 volts by the conventional cathodic protection normally associated with the conduits, storage tanks, and dock. Since the resistance in this electrolytic circuit is very small, a very large current can flow between the barge and the loading arms.

This large current can produce arcing when the metallic loading arms first make contact with the barge. Such arcing can cause the explosive fluids in the barge to ignite. Major catastrophes of this nature have already occurred.

Heretofore, various schemes have been used to prevent such a catastrophe. One such scheme relies on connecting a grounding cable to the barge through an explosion-proof switch so that when arcing across the switch does occur, it will cause no damage. This scheme is not entirely effective because it does not prevent current from continuing to flow when the loading arms are being connected to the barge. Also no effective monitoring system was used for continuously testing the conductivity of the circuits involved to determine those unsafe conditions which can produce a catastrophic explosion.

It is an object of the present invention to provide an effective electric grounding network which forms an integral part with a continuity monitoring system which continuously senses the events which are indicative of normal and abnormal operation, thereby ensuring safe operating conditions in and around the dock, the fuel storage tanks, the loading arms, and the barge.

It is an additional object of the present invention to protect the loading arms against lightening.

SUMMARY OF THE INVENTION

When explosive fuels such as hydrocarbons are pumped into or out of a barge or tanker, a metallic conduit having an insulated flange therein is typically connected to the barge. The method of this invention involves connecting the barge to the earth through a barge-grounding cable, connecting the metallic conduit to the earth through a conduit-grounding cable, and connecting a resistor across the insulated flange. A current source is connected to the earth in a grounding test circuit to continuously feed current through the grounding cables. A current source is also connected to the flange resistor in a flange conduit.

When the barge-grounding cable and the metallic conduit are not connected to the barge, the current flow through the conduit-grounding cable is being continuously monitored to check the cable's continuity. When the barge-grounding cable is connected to the barge, a continuity test is automatically being made to determine effective contact of all the grounding components in the grounding electric circuit. This continuity test will determine the presence of a broken wire or of an ineffective contact, if any.

After establishing an effective electric contact between the barge-grounding cable and the barge, it is then safe to connect (or to disconnect) the metallic conduit to (or from) the barge. A continuity test is continuously being made on the flange circuit to determine the effectiveness of the insulation in the flange.

A plurality of sensing-relays are operatively coupled to the grounding circuit and to the flange circuit to sense the currents flowing through the grounding cables and the flange resistor. The contacts of the relays are operatively interconnected with the contacts of suitable switching means in an alarm circuit having warning devices which can be continuously or intermittently operated to indicate safe and dangerous operating conditions.

In a preferred embodiment, the grounding circuit is supplied with DC current and the flange circuit with AC current. The warning devices include visible lamps and at least one noise-making horn. A first shunt resistor is connected in the conduit-grounding cable and a second shunt resistor is connected in the barge-grounding cable. The two shunt resistors have a common junction. A pair of voltage-sensing relays are connected across the first shunt resistor, and a voltage-sensing relay is connected across the second shunt resistor. A resistor is connected in series with the flange resistor for developing an AC voltage thereacross. This AC voltage is rectified and applied to a pair of voltage-sensing relays. The warning devices are energized by the AC source through a multi-contact, manually-operated switch, an electric relay, and a flasher relay. The operations of the electric relay and of the flasher relay are controlled by the sensing relays. The flasher relay is intermittently operated when an abnormal condition occurs in the flange circuit. The flasher relay causes the intermittent operation of one or more of the warning devices.

DETAILED DESCRIPTION OF THE DRAWING

The sole drawing is a schematic circuit diagram of a preferred embodiment of the grounding and monitoring system used in the practice of the present invention.

DETAILED DESCRIPTION OF A PREFERRED EMBODIMENT

The object of this invention is to bring about an equalization between the potential of an offshore metallic structure such as a barge or ship 1, and the potential of one or more metallic objects, such as the metallic loading arms 2 connected to metallic conduits 2' so as to eliminate any potential difference therebetween, whereby no arcing can take place when the arms are brought near, connected to or disconnected from the barge.

This desired potential equalization is accomplished by electrically grounding the barge 1 with a barge-grounding cable 3, and by grounding the metallic loading arms 2 with a conduit-grounding cable 4 which can be soldered or welded as at 5 to the metallic arms 2. Cable 3 is connected to the earth E by one or more anode rods A drilled into the ground, and cable 4 is connected to the earth by one or more cathode rods C. Rods A and C are preferably of the conventional types used in the cathodic protection circuit (not shown) for protecting the metallic conduits, any storage tanks to which these conduits are connected, and the dock of which they may form part. Grounding cables 3 and 4 have a junction 6. Each conduit 2' typically has a pair of conventional insulated flanges F-1, F-2. Each flange F-1 is coupled to a loading arm 2. No current can flow through either flange when it is properly insulated as required. Such flanges are available commercially.

It is also desired to provide a monitoring system 10 which will continuously monitor the effectiveness of the grounding system which protects barge 1 and loading arms 2 against arcing and lightening.

To monitor the effectiveness of the grounding cables 3 and 4, the monitoring system 10 provides direct-current (DC) voltage to the grounding cables 3 and 4 which form part of a DC test circuit, generally designated as 7. To monitor the effectiveness of the insulation in the flanges F-1, F-2, monitoring system 10 provides an alternating-current (AC) voltage to a flange test circuit, generally designated as 8.

DETAILED DESCRIPTION OF THE MONITORING SYSTEM 10

AC voltage is supplied through a common line L-1 and a line L-2. The conditions or events being monitored are indicated by an alarm circuit 10' having visible and audible warning devices which can assume various forms but in the preferred embodiment include lamps 13–17 and a horn 18. In one particular embodiment of the invention, lamps 13, 15 and 16 were red, lamp 14 was green, and lamp 17 was amber.

System 10 includes a manually-operated main switch 20 having three single-pole, double-throw blades. These blades are normally in the "up" position whereby the switch's contacts a-c are closed. When the blades are in their "down" position, the contacts d-f are closed.

System 10 also includes a main power relay 21 and five electronic sensing relays 22-26. Each electronic relay is energized by the AC power lines L1-L2 connected to its AC terminals g-h. Electric relay 21 receives AC voltage at its terminals g-h. Each electronic relay senses and is operatively controlled by a DC voltage applied to its DC terminals e-f.

The main relay 21 has normally-closed (NC) contacts a-c and normally-open (NO) contacts d-e. Sensing relay 22 has NO contacts a-b; relay 23 has NC contacts a-b; relay 24 has NO contacts a-b; relay 25 has NC contacts a-b, NO contacts b-c, and NC contacts d-d'; and relay 26 has NC contacts a-b, NO contacts b-c, and NO contacts d-d'. Electronic relays 22-26 sense the amplitudes of the DC voltages corresponding to events or conditions that can occur, while the monitoring system 10 protects barge 1 against the undesirable effects which can result from a failure of properly and effectively grounding barge 1 and loading arms 2.

To make certain warning devices in the alarm circuit 10' more effective, there is provided a flasher 27 and a flasher relay 29. Flasher 27 has a heater coil 28 which receives AC voltage at its terminals g-h. Coil 28 controls the opening and closing of its pair of NC contacts a-b which control the AC voltage supplied to the flasher relay 29 having NO contacts a-b.

The DC control voltages for operating electronic relays 25, 26 is obtained from the power lines through a transformer 30 having primary and secondary coils 31, 32 respectively. The secondary coil 32 energizes the previously-mentioned AC flange test circuit 8 which includes: a condenser 33, a resistor 34, and a pair of resistors 35, 36 respectively connected in parallel with the pair of insulated flanges F-1, F-1, as shown. Condenser 33 and resistors 35, 36 limit the amount of current flowing in the flange circuit 8.

The AC voltage developed across resistor 34 is applied to a rectifier bridge 37 which produces a DC voltage $V_3$ which is applied to the contacts e-f of electronic relays 25, 26 with the polarities as shown.

The DC circuit 7 previously mentioned includes a rectifier 40 which feeds DC current I to the anode rods A. The current I from the anode rods A flows from and through the earth E surrounding rods A to the cathode rods C through a path which is known as an "electrolytic" path and which is represented by the dotted lines ep.

When the grounding cable 3 is effectively connected to the barge 1 through a suitable clamp 41, the ep path extends through the barge. A portion $I_2$ of the current I returns through cable 3 to junction 6. Another portion $I_1$ of the current I returns through cable 4 to junction 6. The total current $I = I_1 + I_2$ returns back to the negative terminal of rectifier 40.

Between junction 6 and the flange grounding cable 4 is connected a shunt resistor 42, and between junction 6 and rectifier 40 is connected a shunt resistor 43. Each shunt resistor is a precision resistor which develops thereacross a DC voltage whose amplitude is directly proportional to the current flowing therethrough. As will be subsequently described, the amplitudes of the currents $I_1$ and $I_2$ and hence of the voltages developed across resistors 42, 43 will depend on the continuity conditions of the DC circuit 7 being monitored. Similarly, the voltages developed across resistor 34 will depend on the continuity conditions of the AC flange circuit 8 being monitored.

Electronic relays 23, 24 sense the voltages developed across resistor 42. Electronic relay 22 senses the voltage developed across resistor 43. The amplitudes of the voltages developed across shunt resistors 42 and 43 will depend, among other things, on whether or not the grounding cable 3 establishes effective electric contact with the barge 1 and on whether arms 2 are also connected to the barge.

Recifier 40 is powered from the main power lines L-1, L-2. All the electronic relays 22-26 are also constantly being energized by the AC power lines at the relays' terminals g-h, while AC power to main relay 21 is controlled by the NO contacts a-b of electronic relay 22 and by the NC contacts a-b of relay 23.

One terminal of each warning device is connected to the common power line L-1, while the other terminal of each warning device is connected to the other power line L-2 through the various contacts of the switches and relays which open or close depending on the events or conditions being monitored.

NORMAL NON-OPERATING CONDITION A (CLAMP 41 AND ARMS 2 DISCONNECTED)

In this condition A, system 10 is in its normal operation with the main switch 20 in its "up" position, as shown, and neither the grounding cable 3 nor the loading arms 2 are connected to barge 1, as when barge 1 is at sea.

The only function for system 10 is to test the continuity of and the power in the DC circuit 7. A discontinuity in circuit 7 can occur for many reasons including: defective anode rods A or disconnected cathode rods C, improper contact between the rods and the surrounding earth E, a broken grounding cable 3, ineffective connections 5 with the metallic loading arms 2, a broken cable 4, a defective rectifier 40, lack of AC power supplied to the rectifier, etc.

Also, in the event that a break occurs in cable 4 or that cable 4 is improperly connected to the loading arms 2, then the loading arms, not being effectively grounded to the earth E, present a great danger in that they can attract lightening. But, when cable 4 is properly grounded, it acts as a lightening arrester in addition to its grounding function in the equalization of the potential between barge 1 and loading arms 2.

If the DC circuit 7 has no discontinuity therein, DC current I flows from the positive terminal of rectifier 40 through the rod A, path ep, rods C, cable 4, shunt resistor 42, junction 6, shunt resistor 43, and back to the negative terminal of rectifier 40. The DC voltage $V_1$ across shunt resistor 42 activates electronic relay 24 thereby closing its NO contacts a-b. $V_1$ is not sufficient however to actuate relay 23.

The status of the alarm circuit 10' is as follows: lamp 13 is ON because it is connected across the AC power lines through NC contact a of main switch 20; lamp 15 is ON because it is connected across the power lines through NC contact a of relay 21; lamp 17 is ON because it is connected across the power lines through contacts a-b of relay 24 which have been closed by voltage $V_1$ supplied to terminals e-f of relay 24.

Whenever red lamp 13 is ON, it is unsafe to connect or to disconnect the loading arms 2 to or from barge 1.

Whenever red lamp 15 is ON, it is because cable 3 carries no current $I_2$, as when clamp 41 is not connected to barge 1, or when cable 3 is discontinuous.

Whenever amber lamp 17 is ON, it indicates that current $I_1$ or I flows through the grounding cable 4 and therefore it is continuous.

NORMAL NON-OPERATING CONDITION B (CLAMP 41 CONNECTED)

In Condition B switch 20 is in its "up" position and the grounding cable 3 is effectively electrically connected to barge 1 through clamp 41. A preferred embodiment of such a clamp is described in copending application Ser. No. 969,763 filed 12/15/78, assigned to the same.

It is desired in Condition B to monitor whether or not clamp 41 makes good electric contact with barge 1. Current $I_1$ flows in cable 4, as described in Condition A, and current $I_2$ now also flows in cable 3 through the ep path in barge 1. The voltage $V_1$ developed across shunt resistor 42 activates relay 24 and, therefore, amber lamp 17 stays ON. The voltage $V_1$ is insufficient to actuate relay 23, therefore its contacts a-b remain closed. The voltage $V_2$ developed across shunt resistor 43 actuates relay 22 thereby closing its NO contacts a-b.

The main relay 21 becomes energized since its terminal h is connected to the common power line L-1 and its terminal g is now connected through contacts a-b of relay 22 and contacts a-b of relay 23 to the other power line L-2. The actuation of relay 21 opens its NC contact a and closes its NO contact d. The opening of contact a turns red lamp 15 OFF, and the closing of contact d connects horn 18 across the power lines. The sounding of horn 18 indicates that clamp 41 makes good electric contact with barge 1. Red lamp 13 continues to stay ON since main switch 20 remains in its "up" position. Both horn 18 and red lamp 13 warn the operator to move main switch 20 to its "down" position.

SAFE OPERATING CONDITION C (CLAMP 41 AND ARMS 2 CONNECTED)

Sensing relay 25 is continuously actuated by the DC voltage $V_3$ provided by bridge 37 to its terminals e-f and, therefore, its normally-closed contacts are open and its normally-open contacts are closed. After the operator moves main switch 20 to its "down" position, red lamp 13 goes OFF and green lamp 14 turns ON because it is now connected across the power lines through contact e of switch 20 and contact e of relay 21, which remains energized as in Condition B. Horn 18 goes OFF because contact c of main switch 20 is now open. Amber lamp 17 continues to stay ON as in Conditions A and B. Green lamp 14 turns ON through NO contact e of main switch 20, NO contact e of main relay 21, NO contacts b-c of relay 25, and NC contacts a-b of relay 26. Contact b of relay 26 is connected to the power line L-2.

Thus, in this Condition C only green lamp 14 and amber lamp 17 are ON. When green lamp 14 is ON, it indicates that it is now safe to connect the loading arms 2 to barge 1, whereupon the operator will connect the loading arms 2 to the barge as shown by the solid lines in the drawing.

As long as amber lamp 17 remains ON, the operator is assured that the DC circuit 7 has no discontinuity therein. As long as lamp 14 stays ON it indicates that cable 3 is continuous and is effectively connected to barge 1.

Thus, Condition C is the safe operating condition for the barge and its loading arms 2. A departure from this Condition C will indicate a malfunction or abnormality which will be manifested by the energization of one or more of the other warning devices in the alarm circuit 10'.

ABNORMAL OPERATING CONDITION D (BARGE IMPROPERLY GROUNDED)

Condition D is indicative that either grounding cable 3 is discontinuous or that its clamp 41 does not make an effective contact with barge 1. Current $I_2$ does not flow in cable 3. Because arms 2 are still connected to the barge as in Condition C, rod C is by-passed by the arms 2 and current I flowing through shunt 42 is relatively large.

Electronic relay 24 remains actuated, as in Condition C, but the voltage $V_1$ produced by the shunt resistor 42 is now sufficient to also actuate electronic relay 23, thereby opening its NC contacts a-b and removing power from main relay 21. Accordingly, contacts a-c of main relay 21 close. Red lamp 13 turns ON because it is connected to the power line L-2 through contact d of main switch 20 and through contacts a and c of main relay 21.

Horn 18 turns ON because it is connected to power line L-2 through contact f of main switch 20, contact b of relay 21, contacts b-c of relay 25, and contacts a-b of relay 26.

Red lamp 16 turns ON because it is connected to power line L-2 through contact a of main relay 21. Amber lamp 17 stays ON as in Conditions A-C.

Condition D reveals a very dangerous abnormality and, therefore, red lamp 13 indicates that it is now unsafe to disconnect the loading arms 2 from barge 1; red lamp 15 indicates that barge 1 is not effectively grounded through cable 3, and the sounding of horn 18 only serves to emphasize the warning provided by the red lamps 13 and 15.

The operator then tests the continuity of cable 3 and the clamping effectiveness of clamp 41. Upon finding and correcting the fault he re-establishes current flow $I_2$ in cable 3, thereby returning the monitoring system 10 to its safe operating Condition C.

ABNORMAL OPERATING CONDITION E (FLANGE SHORTED)

Grounding clamp 41 is effectively connected to barge 1, and the loading arms 2 are also connected to barge 1 as in Condition C.

In this Condition E a short circuit has developed across flange F-1 in the circuit 8.

The DC voltage $V_3$ normally produced at the output terminals e-f of rectifier 37 is sufficient to actuate relay 25. But, in Condition E an abnormally-large AC current flows in circuit 8, shown by heavier lines, and, therefore, the DC voltage $V_3$ produced at the output of bridge 37 is now also sufficient to actuate for the first time both relays 25 and 26. Relays 22 and 24 continue to remain actuated, while relay 23 is not actuated. Therefore, main relay 21 is actuated through contacts a-b of relay 22 and contacts a-b of relay 23.

Red lamp 13 is ON through contact d of switch 20 and contacts b-c of relay 26. Flasher 27 becomes actuated because power line L-2 is connected to the terminal h of coil 28 through contacts d'-d of relay 26, diode 50, and NC contacts a-b of flasher 27. The energization of coil 28 causes contacts a-b of flasher 27 to intermittently open and close, thereby intermittently energizing flasher relay 29 and intermittently opening and closing contacts a-b of relay 29. Horn 18 becomes intermittently connected through contact b of relay 29 to the power line L-2, and red lamp 16 becomes intermittently connected to the power line L-2 through the contact a of relay 29. Amber lamp 17 continues to stay ON.

Thus, red lamp 13 is a warning that it is unsafe to disconnect the loading arms 2 from barge 1, the intermittent operation of red lamp 16 and of horn 18 provide visual and audible warnings to the operator that a short in the insulated flange has occurred. When the short is found and AC circuit 8 is restored to its normal operating condition, system 10 will also return to its safe operating Condition C.

ABNORMAL OPERATING CONDITION F (FLANGE CIRCUIT OPEN)

In this condition instead of the flange circuit 8 being short circuited it is now open circuited, while the grounding clamp 41 and the loading arms 2 remain connected to the barge 1. This Condition F is similar to Condition E except that both relays 25, 26 are now deactivated.

Red lamp 13 turns ON through contact d of main switch 20, contacts a-b of relay 25, and contacts a-b of relay 26. Flasher 27 becomes actuated by power line L-2 through contacts a-b of flasher 27, diode 50 and contacts d-d' of relay 25. Flasher 27 causes the intermittent operation of the flasher relay 29 which causes the intermittent operation of red lamp 15 and of horn 18, as described in the previous Condition E. Amber lamp 17 continues to stay ON. When the cause which produced an open circuit 8 is found and repaired, the monitoring system 10 will return to its safe operating Condition C.

ABNORMAL NON-OPERATING CONDITION G (SWITCH 20 IN UP POSITION)

After the barge is loaded with its cargo, the grounding clamp 41 and the loading arms 2 are disconnected from the barge which returns to sea.

In this Condition G, it is desired for the operator to manually return main switch 20 to its normal up position.

Electronic relay 23 is activated by the voltage $V_1$ supplied by shunt resistor 42. Shunt resistor 43 produces an insufficient voltage $V_2$ to actuate relay 22 because the grounding cable 3 is disconnected from barge 1. Electronic relay 25 is actuated by voltage $V_3$ and electronic relay 26 is deactivated. Since electronic relay 22 is deactivated, main relay 21 is also deactivated.

Red lamp 13 is ON because it is connected to power line L-2 through contact d of switch 20, contact c of relay 21, contact a of relay 21, contacts b-c of relay 25, and contacts a-b of relay 26. Horn 18 is ON because it is connected to power line L-2 through contact f of main switch 20, contact b of relay 21, contacts b-c of relay 25, and contacts a-b of relay 26. Red lamp 15 is ON because it is connected to the power line L-2 through contact a of relay 21. Amber lamp 17 continues to stay ON.

When the operator moves the main switch 20 from its down to its up position, the monitoring system 10 is returned to its normal, non-operating Condition A.

ABNORMAL NON-OPERATING CONDITION H (GROUNDING CABLE 4 DISCONTINUOUS)

Condition A, as previously mentioned, is the condition when the grounding circuit 7 is continuous and barge 1 is at sea. The barge can be in the dock but it is not connected to either the grounding clamp 41 or to the loading arms 2. Should the DC circuit 7 become discontinuous, Condition H will be established. In this condition H, electronic relays 22, 23, 24 and 26 are deactivated and electronic relay 25 is activated.

Red lamp 13 is ON because it is connected to power line L-2 through contact a of main switch 20. Red lamp 15 is ON because it is connected to power line L-2 through contact a of relay 21.

When the operator finds the fault in the DC circuit 7 and restores it to its continuous condition, the monitoring system 10 will return to its normal non-operating Condition A.

ABNORMAL NON-OPERATING CONDITION I (FLANGE SHORTED)

In this condition, which is a deviation of Condition A, a short circuit has occurred in a flange F-1 of circuit 8. As a result, an abnormally-large AC current flows in circuit 8 and, therefore, the DC voltage $V_3$ produced at the output of bridge 37 is now sufficient to actuate relay 26. Relays 24, 25 and 26 are activated, while relays 22 and 23 are not activated. Therefore, main relay 21 is also not activated.

Red lamp 13 is ON through contact a of switch 20. Flasher 27 becomes activated because power line L-2 is connected to the terminal h of coil 28 through contacts d'-d of relay 26, diode 50, and NC contacts a-b of flasher 27. The energization of coil 28 causes contacts a-b of flasher 27 to intermittently open and close, thereby intermittently energizing flasher relay 29 and intermittently opening and closing contacts a-b of relay 29. Horn 18 becomes intermittently connected through contact b of relay 29 to the power line L-2, and red lamp 16 becomes intermittently connected to the power line L-2 through the contact a of relay 29. Amber lamp 17 continues to stay ON. Red lamp 15 turns ON because power line L-2 is connected thereto through contact a of relay 21.

Thus, the intermittent operations of red lamp 16 and of horn 18 provide visual and audible warnings to the operator of a shorted flange F-1. When the short is removed, system 10 will return to its normal non-operating Condition A.

What is claimed is:

1. A method for electrically grounding a metallic object and an adjacent metallic structure with a grounding network which forms an integral part with a grounding continuity monitoring system that continuously senses the effectiveness of the grounding network, thereby ensuring safe operating conditions, comprising:
    electrically connecting the structure to the earth through a first grounding means;
    electrically connecting the object to said structure and to the earth through a second grounding means, whereby a grounding circuit is established between said grounding means, said structure and said object including the electrolytic path extending through said structure;
    applying an electric current to said first and second means;
    sensing the amplitudes of the currents flowing in said first and second means;
    electrically connecting an alarm circuit to said grounding network, said alarm circuit including suitably interconnected switching means, relays and warning devices; and
    selectively energizing said warning devices in dependence upon the amplitudes of the sensed currents.

2. The method of claim 1, wherein said structure is a barge and said object is a conduit having at least one insulated flange therein; and
    connecting a resistor across the insulated flange;
    connecting an impedance in series with said resistor, said resistor and said impedance forming a flange circuit;
    connecting a current source to the flange circuit;
    sensing the amplitude of the current flowing in said flange circuit; and
    energizing said warning devices in dependence upon the sensed currents in said grounding circuit and in said flange circuit.

3. The method of claim 2, wherein said relays are responsive to said sensed currents; and
    said warning devices becoming continuously or intermittently energized in dependence upon the respective amplitudes of said sensed currents.

4. A system for equalizing the potential of an offshore structure with the potential of a metallic object, comprising:
    a first grounding cable;
    means connecting the first grounding cable to the earth;
    clamping means removably clamping said first cable to said structure;
    a second grounding cable electrically connected to said object;
    means connecting said second grounding cable to the earth;
    a first current flow sensing device having one terminal connected to a junction on said first cable and another terminal connected to said second cable;
    a current source supplying current to said first and second grounding cables;
    a second current flow sensing device connected between said junction and said current source;
    said source, said sensing devices, said cables, said object, and said structure forming a test circuit which includes the electrolytic path through said structure, the conductivity of said test circuit being dependent on the effectiveness of the electric connection between said first grounding cable and said structure, and on the effectiveness of the electric connection between said second grounding cable and said metallic object; and
    means for monitoring said conductivity of said test circuit.

5. The system of claim 4 wherein said monitoring means includes an alarm circuit; and
    said alarm circuit including switching means, relays, and warning devices operatively interconnected with said first and second current flow sensing devices, whereby changes in the electric conductivity of said test circuit change the states of certain ones of said warning devices.

6. The system of claim 5 wherein certain ones of said warning devices become selectively energized in dependence upon the voltages developed across said current sensing devices.

7. The system according to claim 6 wherein said structure is a barge and said object is a metallic pipe, and further comprising:
    an insulated flange in said pipe;
    a resistor connected in parallel with said flange;
    impedance means in series with said resistor, said impedance and said resistor forming a flange circuit;
    a current source energizing said flange circuit for developing a voltage across said impedance which corresponds to the current flow in said flange circuit; and
    certain ones of said relays being responsive to said voltage across said impedance means for changing the state of certain ones of said warning devices in dependence upon the voltage developed across said parallel resistor, said latter voltage being indicative of the effectiveness of said flange as an electric insulator.

8. The system according to claim 7 wherein said relays include a flasher relay for intermittently energizing certain ones of said warning devices.

* * * * *